United States Patent
Mathews, Jr. et al.

(10) Patent No.: US 11,327,870 B2
(45) Date of Patent: May 10, 2022

(54) SYSTEM AND METHODS FOR GENERATING FAULT INDICATIONS FOR AN ADDITIVE MANUFACTURING PROCESS BASED ON A PROBABILISTIC COMPARISON OF THE OUTPUTS OF MULTIPLE PROCESS MODELS TO MEASURED SENSOR DATA

(71) Applicant: General Electric Company, Schenectady, NY (US)

(72) Inventors: Harry Kirk Mathews, Jr., Clifton Park, NY (US); Sarah Felix, Niskayuna, NY (US); Subhrajit Roychowdhury, Schenectady, NY (US); Saikat Ray Majumder, Niskayuna, NY (US); Thomas Spears, Springdale, OH (US)

(73) Assignee: General Electric Company, Schenectady, NY (US)

( * ) Notice: Subject to any disclaimer, the term of this patent is extended or adjusted under 35 U.S.C. 154(b) by 140 days.

(21) Appl. No.: 16/242,194

(22) Filed: Jan. 8, 2019

(65) Prior Publication Data
US 2020/0218628 A1 Jul. 9, 2020

(51) Int. Cl.
*G06F 11/34* (2006.01)
*B29C 64/393* (2017.01)
(Continued)

(52) U.S. Cl.
CPC ........ *G06F 11/3447* (2013.01); *B29C 64/393* (2017.08); *G06F 11/3409* (2013.01);
(Continued)

(58) Field of Classification Search
CPC .. G06F 11/3447; G06F 11/3409; G06F 17/18; B29C 64/393; B33Y 50/02
(Continued)

(56) References Cited

U.S. PATENT DOCUMENTS 6,892,163 B1 * 5/2005 Herzog ................ G06K 9/6278
700/30
9,044,827 B2   6/2015 Song et al.
(Continued)

FOREIGN PATENT DOCUMENTS

WO   2018052487 A1   3/2018

OTHER PUBLICATIONS

Craeghs, Tom et al., "Online Quality Control of Selective Laser Melting", Proceedings of the Solid Freeform Fabrication Symposium, Austin, Aug. 17, 2011, (pp. 212-226, 15 total pages).
(Continued)

*Primary Examiner* — Eman A Alkafawi
*Assistant Examiner* — Aeysha N Sultana
(74) *Attorney, Agent, or Firm* — Dority & Manning, P.A.

(57) ABSTRACT

Generating fault indications for an additive manufacturing machine based on a comparison of the outputs of multiple process models to measured sensor data. The method receiving sensor data from the additive manufacturing machine during manufacture of at least one part. Models are selected from a model database, each model generating expected sensor values for a defined condition. Difference values are computed between the received sensor data and an output of each of the models. A probability density function is computed, which defines, for each of the models, a likelihood that a given difference value corresponds to each respective model. A probabilistic rule is applied to determine, for each of the models, a probability that the corresponding model output matches the received sensor data. An indicator is output of a defined condition corresponding to a model having the highest match probability.

20 Claims, 7 Drawing Sheets

(51) Int. Cl.
*G06F 17/18* (2006.01)
*B33Y 50/02* (2015.01)
*G06F 30/00* (2020.01)

(52) U.S. Cl.
CPC .............. *G06F 17/18* (2013.01); *G06F 30/00* (2020.01); *B33Y 50/02* (2014.12)

(58) Field of Classification Search
USPC ........................................................ 702/182
See application file for complete search history.

(56) References Cited

U.S. PATENT DOCUMENTS

| 9,977,425 | B1 | 5/2018 | McCann et al. | |
| 10,725,459 | B2* | 7/2020 | Good | B23K 26/342 |
| 2015/0045928 | A1* | 2/2015 | Perez | B29C 64/112 |
| | | | | 700/110 |
| 2015/0165683 | A1* | 6/2015 | Cheverton | B29C 64/112 |
| | | | | 382/141 |
| 2016/0114431 | A1 | 4/2016 | Cheverton et al. | |
| 2016/0184893 | A1* | 6/2016 | Dave | B33Y 50/02 |
| | | | | 419/53 |
| 2016/0185048 | A1* | 6/2016 | Dave | B29C 64/153 |
| | | | | 700/119 |
| 2016/0236414 | A1* | 8/2016 | Reese | B33Y 50/02 |
| 2017/0090462 | A1 | 3/2017 | Dave et al. | |
| 2017/0120376 | A1 | 5/2017 | Cheverton et al. | |
| 2017/0129052 | A1* | 5/2017 | Buller | B33Y 50/02 |
| 2019/0118300 | A1* | 4/2019 | Penny | B33Y 50/02 |
| 2019/0384274 | A1* | 12/2019 | Bharadwaj | G05B 19/4099 |
| 2020/0125044 | A1* | 4/2020 | Ide | G06N 3/08 |

OTHER PUBLICATIONS

Clijsters, S. et al., "In situ quality control of the selective laser melting process using a high-speed, real-time melt pool monitoring system", The International Journal of Advanced Manufacturing Technology, vol. 75, Issue: 5-8, Nov. 2014, DOI: 10.1007/s00170-014-6214-8, (pp. 1089-1101, 13 total pages).

Lashlee et al, "Space Control Using Moving Bank Multiple Model Adaptive Estimation", Proceeding Of The International Conference On Decision & Control, Austin, TX, Dec. 7-9, 1988, vol. 1, pp. 712-717 (Abstract Only).

Maybeck et al, "Performance enhancement of a multiple model adaptative estitmator", Proceedings Of The Conference On Decision And Control, San Antonio, Dec. 15, 1993, Conf. 32, pp. 462-468 (Abstract Only).

Roumeliotis et al, "Sensor fault detection and identification in a mobile robot", Intelligent Robots And Systems, Oct. 13, 1998, pp. 1383-1388 (Abstract Only).

Zhu Jiangsheng et al, "Fault detection and isolation for wind turbine electric pitch system", 2017 IEEE 12$^{th}$ International Conference On Power Electronics And Drive Systems (PEDS), IEEE, Dec. 12, 2017, pp. 618-623.

* cited by examiner

SYSTEM AND METHODS FOR GENERATING FAULT INDICATIONS FOR AN ADDITIVE MANUFACTURING PROCESS BASED ON A PROBABILISTIC COMPARISON OF THE OUTPUTS OF MULTIPLE PROCESS MODELS TO MEASURED SENSOR DATA

FIELD OF THE INVENTION

The disclosed embodiments are directed to system for generating fault indications and quality metrics for an additive manufacturing process based on a probabilistic comparison of the outputs of multiple process models to measured sensor data.

BACKGROUND

The term "additive manufacturing" refers to processes used to synthesize three-dimensional objects in which successive layers of material are formed by an additive manufacturing machine (AMM) under computer control to create an object using digital model data from a 3D model. One example of powder-bed fusion based additive manufacturing is direct metal laser sintering (DMLS), which uses a laser fired into a bed of powdered metal, with the laser being aimed automatically at points in space defined by a 3D model, thereby melting the material together to create a solid structure. The term "direct metal laser melting" (DMLM) may more accurately reflect the nature of this process since it typically achieves a fully developed, homogenous melt pool and fully dense bulk upon solidification. The nature of the rapid, localized heating and cooling of the melted material enables near-forged material properties, after any necessary heat treatment is applied.

The DMLM process uses a 3D computer-aided design (CAD) model of the object to be manufactured, whereby a CAD model data file is created and sent to the fabrication facility. A technician may work with the 3D model to properly orient the geometry for part building and may add supporting structures to the design, as necessary. Once this "build file" has been completed, it is "sliced" into layers of the proper thickness for the particular DMLM fabrication machine. Process parameters such as laser power, laser beam focus, and scan speed, are assigned to appropriate locations in the part. Finally, the build file is downloaded to the machine to allow the build to begin. The DMLM machine uses, e.g., a 400 W Yb-fiber optic laser. Inside the build chamber area, there is a powder dispensing platform and a build platform along with a recoater blade used to move new powder over the build platform. The metal powder is fused into a solid part by melting it locally using the focused laser beam. In this manner, parts are built up additively layer by layer—typically using layers 20 to 100 micrometers thick. This process allows for highly complex geometries to be created directly from the 3D CAD data, automatically and without any tooling. DMLM produces parts with high accuracy and detail resolution, good surface quality, and excellent mechanical properties.

In conventional approaches, DMLM process quality control is maintained by doing diagnostics on machine performance in between builds. Since single builds can take several days or more and may produce a batch of multiple parts, between-build diagnostics present a risk of not catching process deviations until they have introduced undue cost or burden. Moreover, part quality control is typically executed in complex downstream inspection processes that occur weeks later after a high level of value has already been added to the component, including, for example, heat treatments.

One objective of process monitoring is to detect shifts or disturbances in the process parameters (e.g. laser power or beam focus). Monitoring steady state, or an averaged, measurement of a melt pool characteristic makes it difficult to resolve changes in individual parameters because of coupling. For example, a meltpool with higher average intensity may be a result of high laser power or lower scan speed. Additional diagnostics may help discriminate parameter shifts but adds complexity and potentially longer computation time to the system. Another challenge arising in conventional in-situ process monitoring is measurement variability from known sources such as part geometry, scan path history, sensor viewing angle, and optic-induced distortions. These variations undermine the ability of the model-based analysis to detect changes due to faulty or unexpected conditions.

SUMMARY

Disclosed embodiments provide reliable in-process monitoring that can detect deviations that may be indicative of process drift, defects, and poor resultant part quality. By incorporating time-dependent models of laser-on transient behavior, the disclosed embodiments provide a mode of monitoring that can enhance the ability of a single sensor to distinguish changes due to different types of process deviations. Disclosed embodiments provide spatially-dependent models of process and sensor behavior to capture known phenomena, which improves the ability of the model-based analysis to detect changes due to faulty or unexpected conditions in the face of measurement variability from known sources such as part geometry, scan path history, sensor viewing angle, and optic-induced distortions.

The disclosed embodiments provide "design knobs" for model-based analysis that allow tuning of performance specifications such as spatial resolution and error rates. Kernels may be used to define groups of measurements over which model-based analysis is performed. Kernels can be defined in time or space and can represent multiple scales, allowing a flexible framework for tuning the analysis for different fault scenarios and objectives.

Disclosed embodiments may include monitoring DMLM processes using a time-dependent model of the laser-on transients at the beginning of each laser mark. Local geometry and scan history may be included in the model to account for varying melt pool process response. Build plate position and scan direction may be included in the model to account for variations in the sensor response. Model-based analysis may be performed over multiple scales in time and space.

In disclosed embodiments, in-situ model-based monitoring of DMLM may use online sensors detecting aspects of the melt pool during the process. Such sensors may include photodiodes, pyrometers, cameras, and other transducers detecting different ranges of electromagnetic radiation. Measurements from these sensors may correspond to some outputs of the model. In addition, input information may be used that can be synchronized with the measurements through hardware or software. For example, inputs may include commanded laser scanner signals, other machine conditions, material and design information, and/or scan strategy identifiers. There may be additional model outputs that are not directly measured, but are estimated, such as with a Kalman Filter, which may be referred to as virtual measurements. Models may be constructed and trained on a determined amount of data that includes the corresponding inputs and outputs. For example, one type of model is a mean melt pool response waveform, which is considered to be a static model in that the response predicted by the model is not updated by new measurement or input values. Another example is an autoregressive moving average (ARMA) model in which the predicted output at each point in time is a function of inputs and outputs at a number of previous time steps. The models may also include information about statistical uncertainty in their predictions.

In disclosed embodiments, models are obtained and used for model-based process monitoring. In one implementation, a model for a normal process may be provided and measured data may be compared to this model to detect unknown anomalies. Alternatively, various process conditions or faults can be explicitly modeled. In such as case, measured data is compared to these models to determine the most likely condition that generated the data. Such a configuration may also allow for classification of an unknown anomaly that does not correspond to a model. Other implementations may provide an algorithm having a computational component, such as an observer or Kalman filter, that estimates unmeasured quantities that can be monitored and controlled.

In disclosed embodiments, a multiple model hypothesis testing (MMHT) algorithm may be used to infer information about a DMLM process. In such a case, a set of models may be identified for multiple process conditions or faults, including normal conditions. These models may characterize uncertainty such that there is a probabilistic distribution associated with the prediction of each model. The MMHT algorithm may use Bayes' rule to compute probabilities that a measurement was generated from the distributions associated with each model. Decision criteria can be used to assign a single classification to the measurement, or the collection of probabilities can be stored for further evaluation.

In one aspect, the disclosed embodiments provide a method (and corresponding system and software) for generating fault indications for an additive manufacturing machine based on a comparison of the outputs of multiple process models to measured sensor data. The method includes receiving, via a communication interface, sensor data from the additive manufacturing machine during manufacture of at least one part. The method further includes selecting a plurality of models from a model database, each model generating expected sensor values for a defined condition. The method further includes computing difference values between the received sensor data and a prediction from each of the plurality of models. The method further includes computing a probability density function defining, for each of the models, a likelihood that a given difference value corresponds to each respective model. The method further includes applying a probabilistic rule to determine, for each of the models, a probability that the corresponding model output matches the received sensor data. The method further includes outputting an indicator of a defined condition corresponding to a model having the highest match probability.

Embodiments may include one or more of the following features. The method may include tagging the received sensor data with an identifier of a part of the one or more parts. The received sensor data may be tagged to indicate whether the laser was on or off when the sensor data was produced. The defined condition may be a fault condition or a quality metric. The method may include defining a kernel specifying a subset of the received sensor data which is used in computing the probability density function. By grouping sensor data together in time or space using kernels, the system can effectively average out random noise while still being sensitive to localized variations. The sensor data may be received from an on-axis sensor and an off-axis sensor.

DETAILED DESCRIPTION

In direct metal laser melting (DMLM), one or more in-process diagnostics may be used to monitor the response of the melt pool when the laser is striking the powder bed. In disclosed embodiments, the measured response from the melt pool may represent quantities such as light intensity, temperature, depth, or area, depending on the diagnostic.

Figure 1:
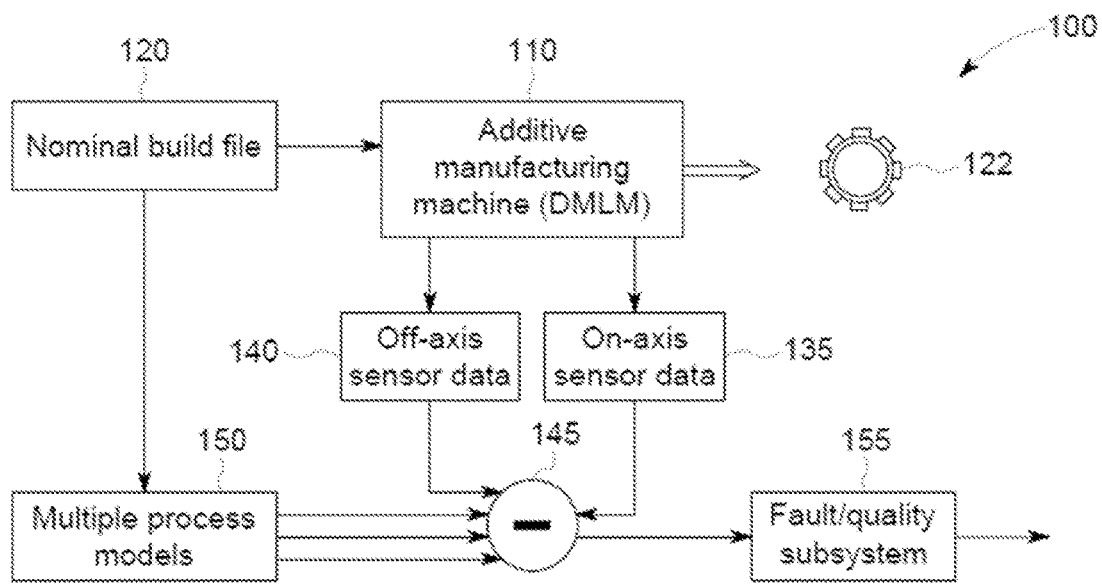
FIG. 1 is a diagram of a system for generating fault indications and quality metrics for an additive manufacturing process based on a comparison of the outputs of multiple process models to measured sensor data.

Features of the measured response may be computationally compared with a high-fidelity model or set of models to infer information about the process and/or part. The models may describe dynamic responses and capture spatial, geometric, thermal and other effects. Data may be compared to models over sets of measurements that span different temporal or spatial scales. Examples of inferred information include process parameters such as laser power and scan speed; unmeasured melt pool attributes such as depth and temperature; anomalies such as optics defects and smoke interference; and material defects such as porosity. The analysis could be performed online or offline and the inferred information could be used for process control, part quality control, and fault detection, as well as process optimization FIG. 1 is a diagram of a system 100 for generating fault indications and quality metrics for an additive manufacturing process based on a comparison of the outputs of multiple process models to measured sensor data. A set of nominal build parameters, in the form of a nominal build file 120, is input to an additive manufacturing machine (AMM) 110, such as, for example, a direct metal laser melting (DMLM) printer (i.e., machine). The nominal build file 120 may be in the form of a common layer interface (CLI) file, which may include a set of scan parameters, i.e., build parameters, as well as other process parameters. As the DMLM printer 110 performs the build of a part 122, based on the nominal build file 120, sensor data is collected from various sensors associated with the printer, including on-axis photodiode sensor data 135 and off-axis photodiode sensor data 140.

The sensor data (135 and 140) is received by a residual generator 145, which is a processing subsystem adapted to compute a residual, i.e., a difference, between data streams. The residual generator 145 compares the received sensor data (135 and 140) to the output of multiple process models 150, as discussed in further detail below. The output of the residual generator 145 is received by a fault determination/quality metrics processing subsystem 155, which generates and outputs fault indications and quality metrics based on the received residual data stream.

As the AMM 110 performs a build, the machine produces output data from melt pool sensors, e.g., in the form of data files in technical data management streaming (TDMS) format.

Data is also produced by other sensors of the machine, such as, for example: data from actuator sensors associated with actuators in the AMM 110, such as galvanometer position sensors; environmental sensors, such as, for example, atmospheric pressure, oxygen level, airflow, smoke, etc.; and data from sensors monitoring characteristics of the melt pool, such as, for example, photodiode, pyrometer, acoustic emission, etc. Data from these sensors may be used in a number of different ways. For example, these other data sources could produce data that is made part of the predictive model. As another example, the data could be used to corroborate the predictive data from the model. In general, data from these sensors provide ground truth allowing confidence in the model results to be increased.

A photodiode based meltpool monitoring system from EOS was used for experimental testing on their machines. The heart of the system is a set of two silicon photodiodes. One of the diodes is mounted in the build chamber and is aimed at the entirety of the build plate. The second photodiode is situated such that it follows the meltpool through the weld laser optical path. Light from the plume and meltpool travels back through the scan head and is reflected onto the photodiode. Also included are an amplifier and data acquisition (DAQ) that collects the metadata channels necessary for the evaluation of the data.

Figure 2:
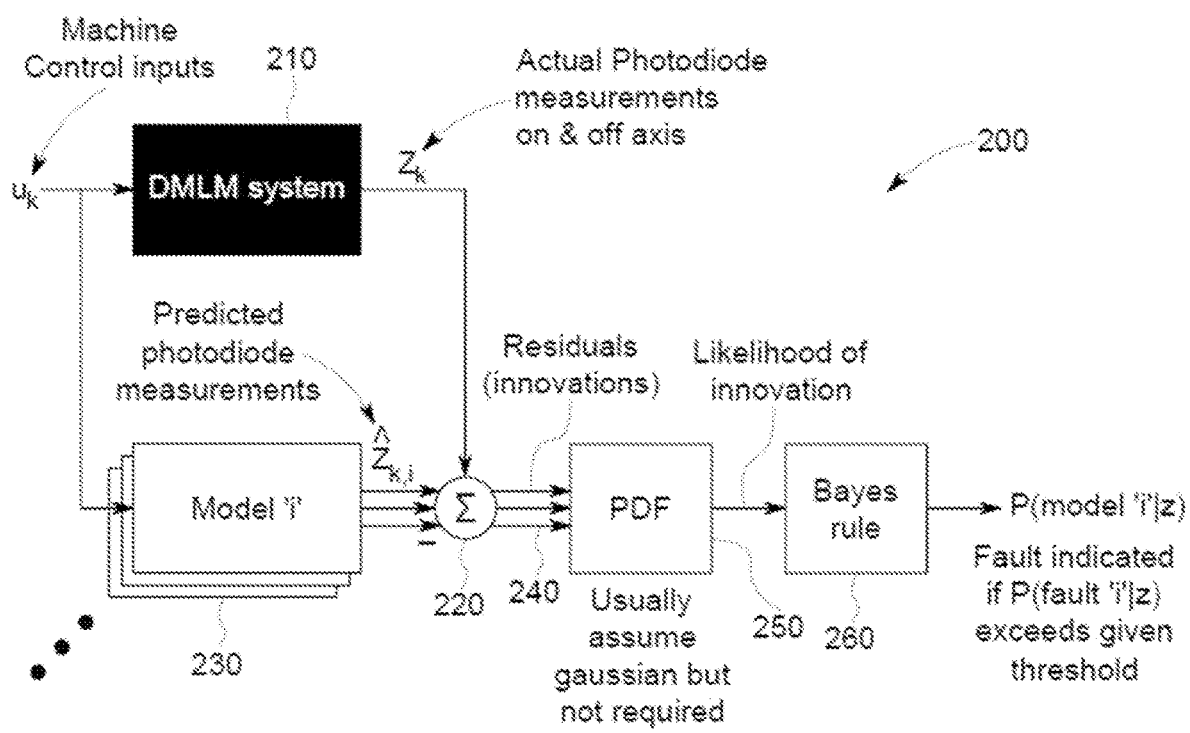
FIG. 2 depicts a system for performing statistical analysis of a comparison of the outputs of multiple process models to measured sensor data to generate fault indications.

FIG. 2 depicts a system 200 for performing statistical analysis of a comparison of the outputs of multiple process models to measured sensor data to generate fault indications. A DMLM system 210 may have, for example, a DMLM machine (e.g., AMM 110) and associated sensors (e.g., on-axis photodiode sensor data 135 and off-axis photodiode sensor data 140). A residual generator 220 compares the received sensor data to the output of multiple process models 230 (model "i", model "i+1", etc.). In disclosed embodiments, each received sensor data stream (e.g., on-axis and off-axis) is compared to an output of each of the models 230, thereby forming a set of residual outputs 240 for each sensor data stream. The one or more sets of residual outputs 240 are received in a probability density function (PDF) processing subsystem 250 which computes a PDF for each model-to-sensor data comparison. The computed PDFs are input to a processing subsystem 260 which applies an algorithm, e.g., Bayes' rule, to determine which of the multiple process model most closely matches the measured sensor data. Specifically, the Bayes' rule subsystem 260 outputs a probability for each model. The Bayes' rule subsystem 260 outputs an indication of which model is the most likely correct model for the received sensor data.

Figure 3:
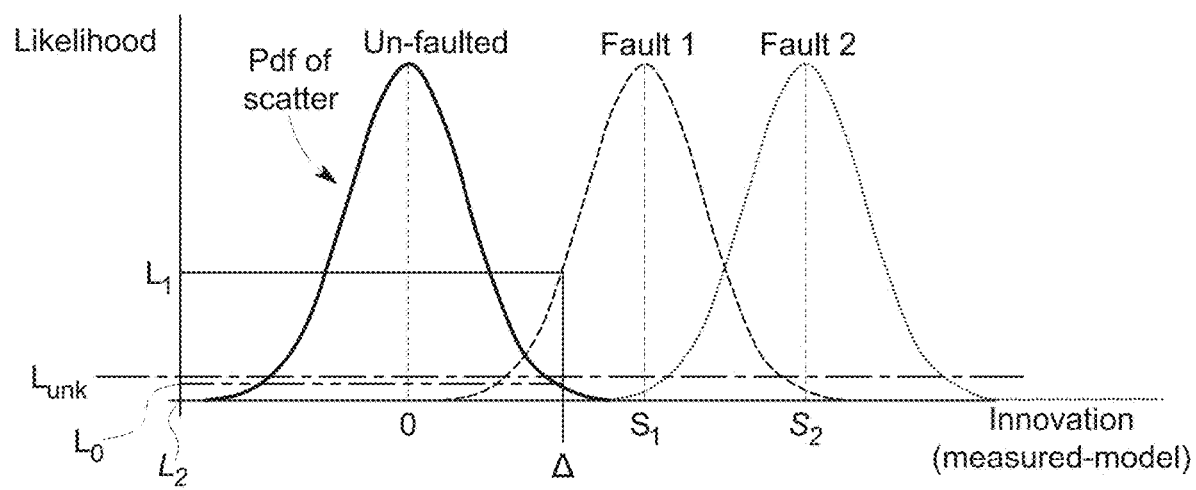
FIG. 3 is a plot of probability density functions for multiple process models.

FIG. 3 is a plot of probability density functions (PDFs) for multiple process models. As explained above, sensor measurements are compared to multiple process models which generate expected or predicted sensor measurement values for a particular set of conditions and control inputs. If the predicted values generated by a model match, in a probabilistic sense, the measured sensor data, then that model can be deemed the true or correct model. Each model may be designed to represent a specific condition of the process, such as, for example, "normal operations," "fault 1," "fault 2," etc. Under a multiple model hypothesis test (MMHT), each model is compared to measured data, e.g., by computing a difference or residual, and for each difference a probability is determined. In other words, the result indicates a value of a probability density function (PDF), i.e., likelihood, at the difference computed for each model.

As shown in FIG. 3, at a given value of A, which is the difference between the measured signal and the predicted signal, there are different likelihoods that a given model is correct. The value of $L_{unk}$ is the threshold of likelihood such that if $L_{unk} > L_0 \vee L_1 \vee L_2$ the process is categorized as being of an unknown fault. The example depicted would be classified as Fault 1, but in the absence of Fault 1 the signal would have been selected as an "unknown fault." Setting the proper unknown likelihood value requires understanding the nature of the noise of the signals used to generate the empirical models. The viability of setting a permanent value for the unknown likelihood is based on the distribution of the noise in the empirical model and its covariance. The amount of covariance will closely relate to the applicability of the assumption that the individual laser on transients (LOTs) that comprise the empirical model are decoupled from one another. Stated differently, the assumption is that the LOTs are not dependent on each other and can appropriately be treated as true random variables. This reduces the number of models needed to capture nominal behavior.

As explained above, Bayes' rule is applied to the computed PDFs to convert the determined likelihoods into a probability that each model (model "i") has generated the measured sensor data, i.e., the probability that model "i" is correct. In other words, the likelihoods are the probability of the measurement, given the model, for each model. Bayes' rule, in effect, inverts this and gives the probability of the model, given the measurement. If the model having the highest probability is one that is designed to represent a particular fault condition, e.g., fault 1, then fault 1 is deemed to be present.

Figure 4A:
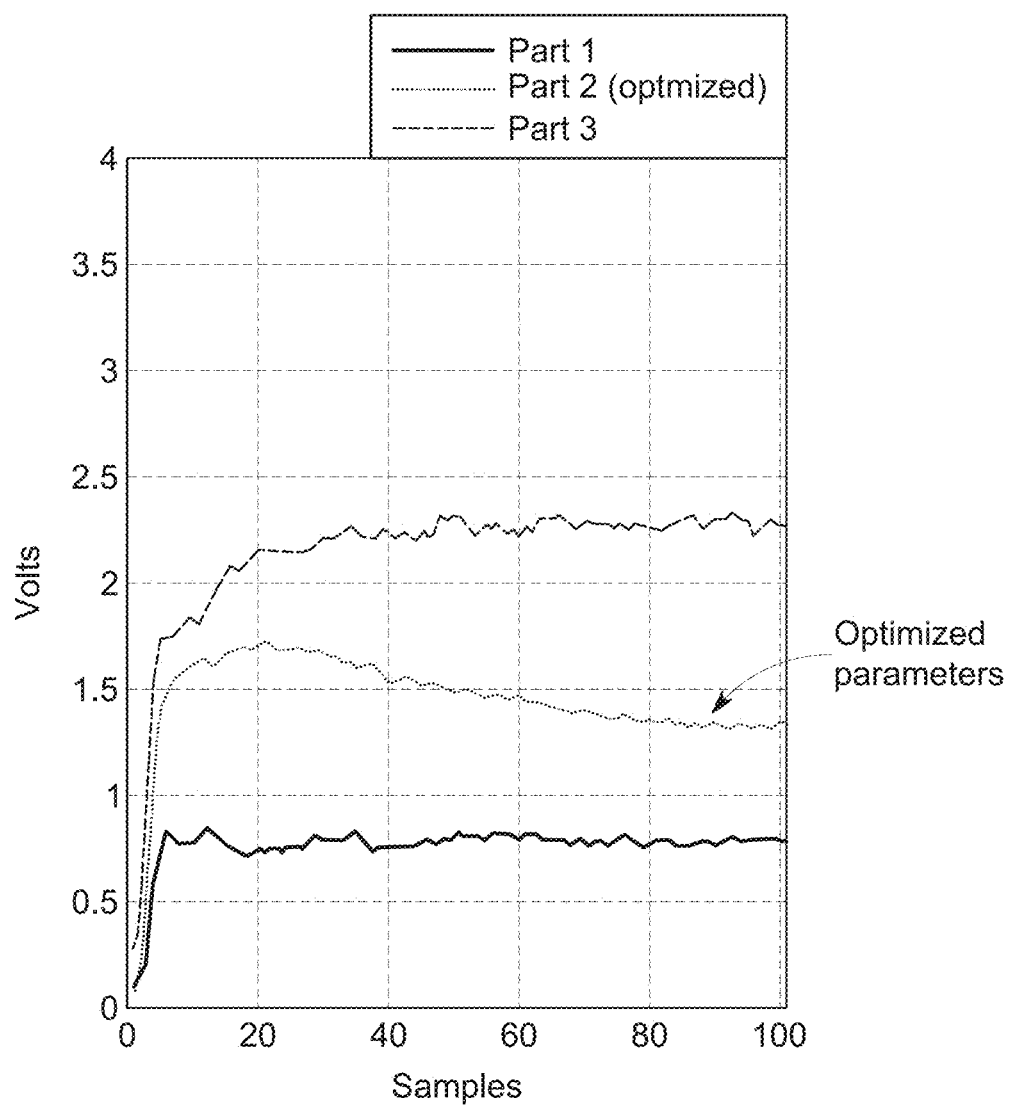
FIGS. 4A and 4B are plots of sensor outputs for on-axis and off-axis photodiodes, respectively, in response to a laser-on transient.
Figure 4B:
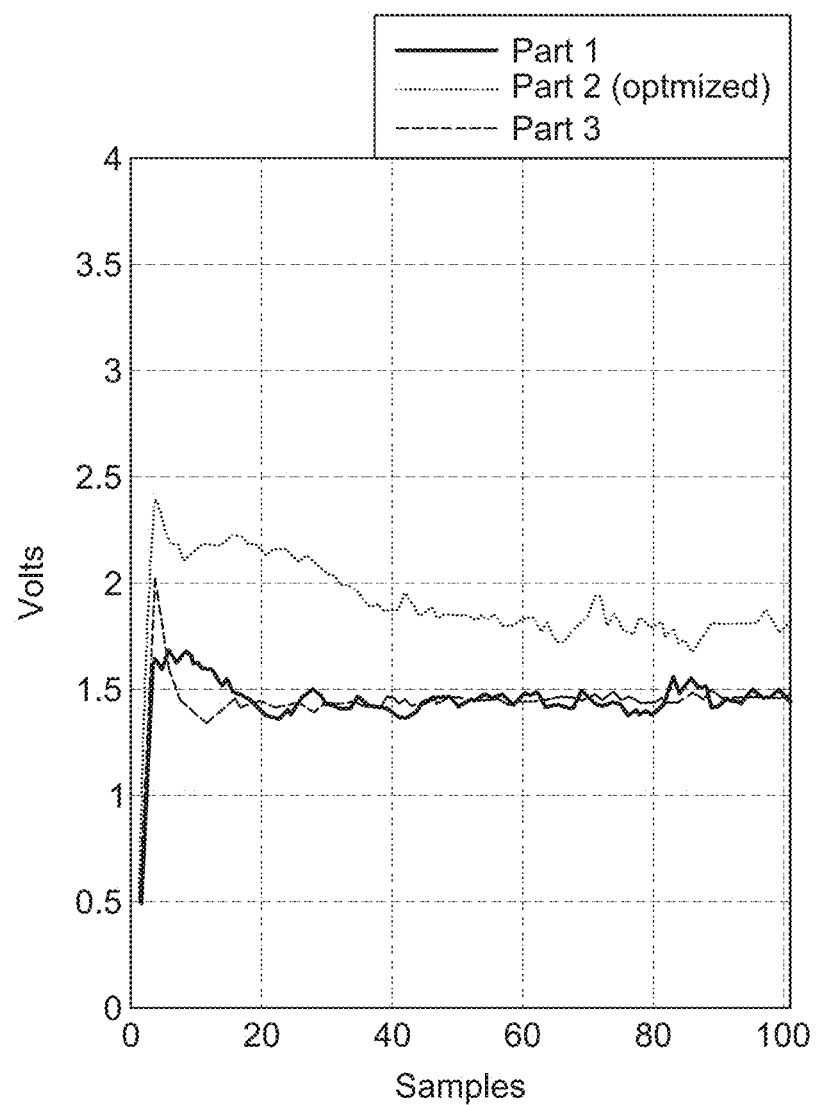

FIGS. 4A and 4B are plots of averaged sensor outputs for on-axis and off-axis photodiodes, respectively, in response to a laser-on transient (LOT). The two plots shown in these figures are averaged output of photodiode in volts versus samples, as read by an on-axis sensor and an off-axis sensor for three different parts on the build plate. Three cylinders were created on a build plate: a center cylinder (part 2) (see FIG. 5) built using nominal conditions, a lower left cylinder (part 1) built using parameters that deposit less energy into the material, and an upper right cylinder (part 3) built with parameters that imbue it with too much energy.

Models for LOT response can be developed based on an understanding of the physics of the materials and the manufacturing process. However, in this example, a large number of measurements were taken and averaging was performed with respect to sample number, i.e., the x-axis. In disclosed embodiments, these plots are used as a model for the respective parts. In this example, the model is a line plot, i.e., just a sequence of values, but various types of equations (e.g., differential equations) and curve fitting (e.g., regression) can be used to specify the models. As explained in further detail below, for an on-axis sensor (e.g., a photodiode) measured behavior is different than steady state conditions and this makes it possible to better distinguish between the models (i.e., the plotted lines have enough spacing between them to allow identification of a specific part out of the three being examined). "On-axis" is used to refer to a sensor which is looking down the path that the laser is pointed, using same optics as are steering the laser. This means that the on-axis sensor is looking directly at the melt pool and its field of view moves with laser. An off-axis sensor may be, for example, on the side in a fixed position looking at the entire build plate.

As noted above, the laser-on transient (LOT) is a source of dynamic information conducive to leveraging a time-dependent model for process monitoring. During initial formation of the melt pool at the beginning of each scan, several dynamic effects are in play such as laser power absorption, powder melting, and heat conduction. These components have varying time constants depending on the combination of process parameters, such as laser power and scan speed, as well as substrate characteristics such as powder composition and location of previously-fused metal (e.g., determined by part geometry and scan path). The result is a response signature that exhibits multiple features that can be mapped to individual process parameters such as laser power, scan speed and spacing between scanned lines. In contrast, using a steady state or average signal from the diagnostic may not decouple changes in individual process parameters. For example, if the intensity of light emitted from the melt pool and measured by a photodiode decreases on average, it could be due to either a reduction in laser power or an increase in scan speed.

Figure 5:
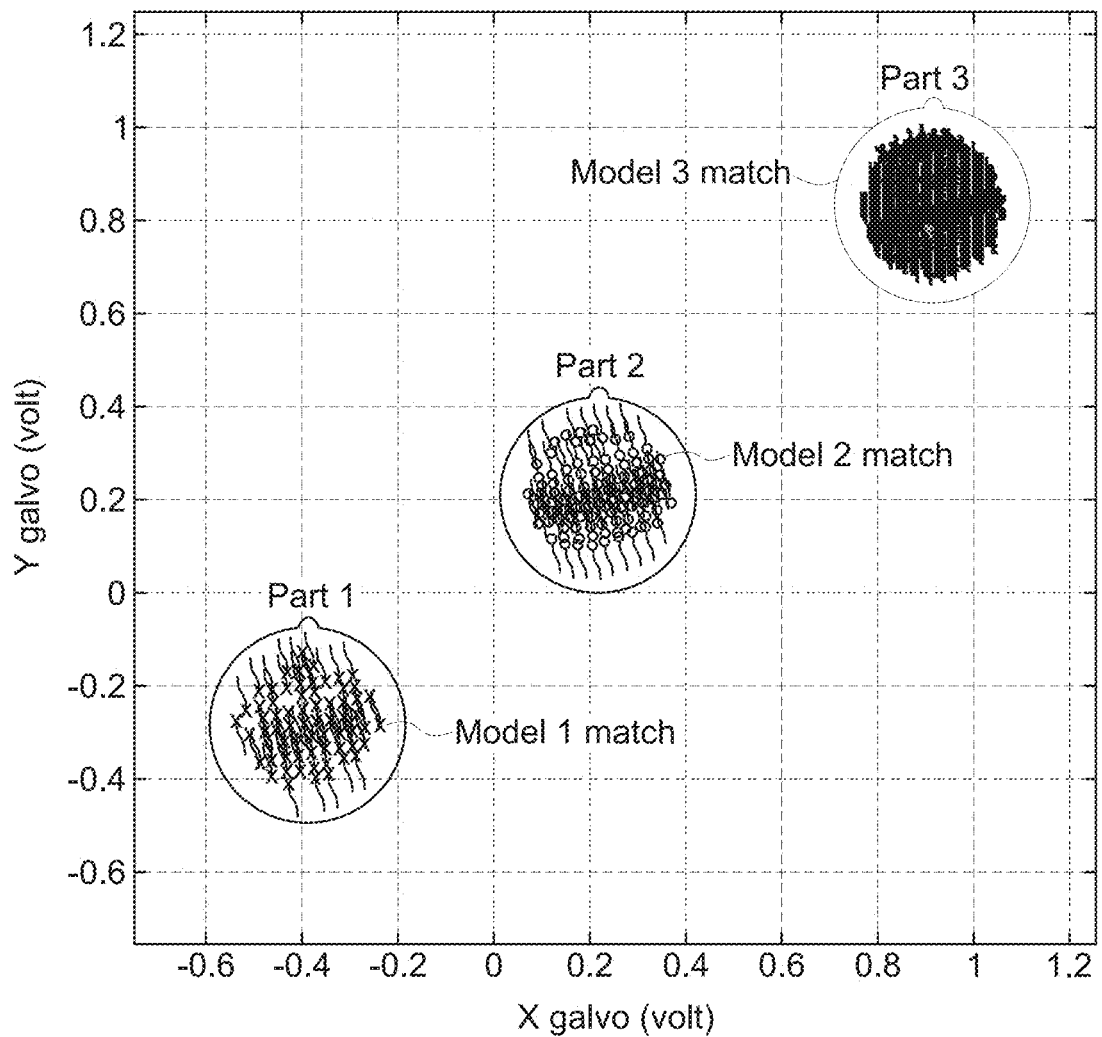
FIG. 5 is plot of results of multiple model hypothesis testing performed on three parts built under different conditions.

FIG. 5 is a plot of results of multiple model hypothesis testing performed on three parts built under different conditions. As noted above, a build with three cylinders was created: a center cylinder (part 2) built using nominal conditions; a lower left cylinder (part 1) built using parameters that deposit less energy into the material; and an upper right cylinder (part 3) built with parameters that imbue it with too much energy. Each dot, and associated dash, on the cylinders represents the first x samples of measured sensor data from a laser mark (i.e., the laser on transient). The output of the MMHT algorithm for the sensor data associated with each cylinder is evaluated to determine which tested model has the highest probability. The center cylinder (part 2) was found to be a match for model 2, which represents normal conditions, the lower left cylinder (part 1) was found to be a match for model 1, which represents a low energy fault, and the upper right cylinder (part 3) was found to be a match for model 3, which represents a high energy fault. In disclosed embodiments, if the likelihood of all of the models is low, a determined threshold may be used to prevent the Bayes' rule algorithm from matching with any of the models.

Figure 6:
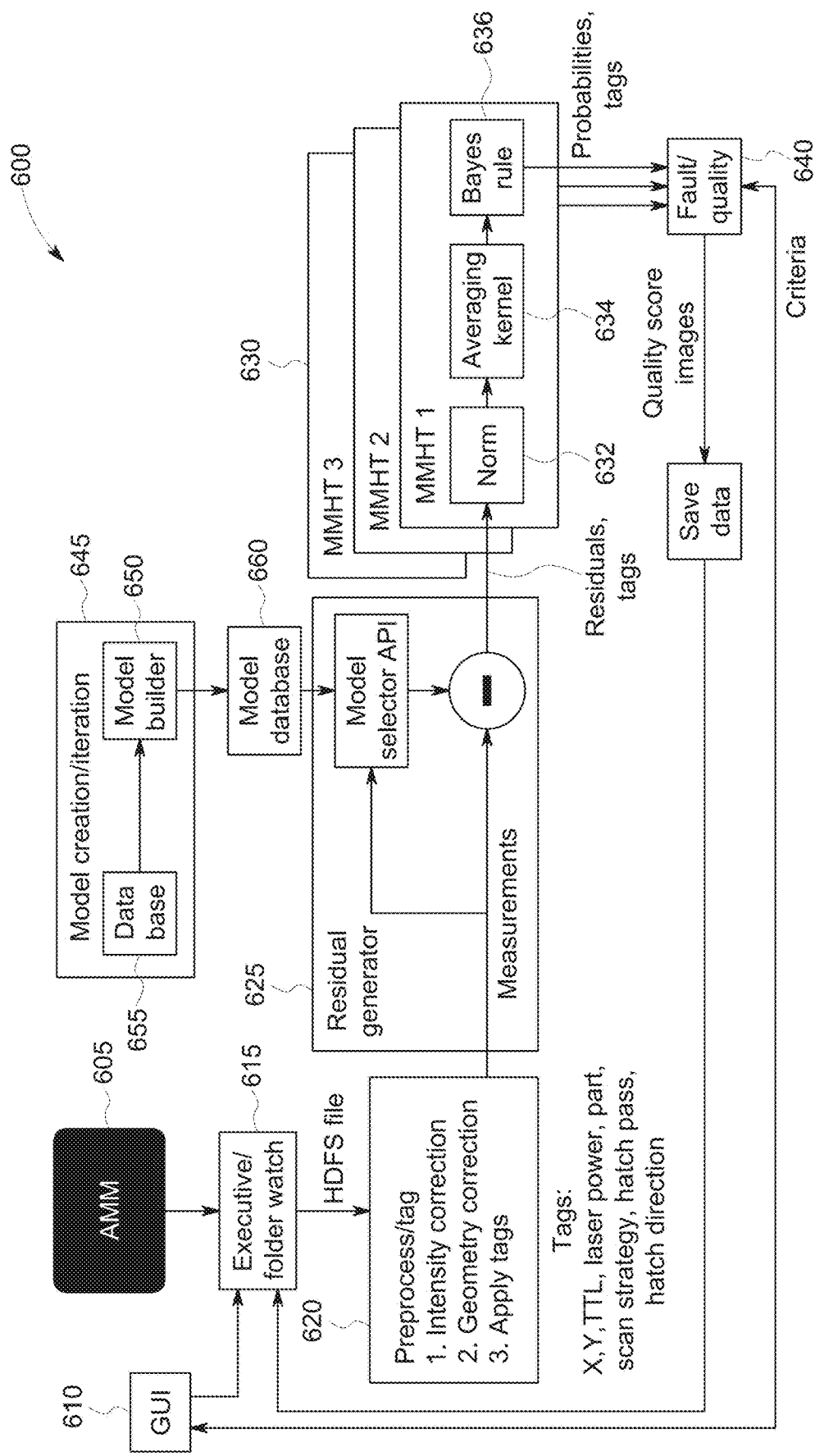
FIG. 6 is a block diagram of a system for generating fault indications and quality metrics based on a multiple model hypothesis testing of measured sensor data.

FIG. 6 is a block diagram of a system 600 for generating fault indications and quality metrics based on a multiple model hypothesis testing of measured sensor data. The system software architecture depicted in this example includes a software package that runs on a computer associated with the EOS Plasmo AMM 605. An operator can interface with the software via a graphical user interface (GUI) 610 which will have two main interactions with the software, analysis and model building. The analysis aspect of the software is initiated by activating an executive/folder watch 615 functionality which coordinates the analytical activities and watches for newly created data files. The executive 615 will pass a raw data file for one layer (e.g., an HDFS file) to a preprocessing function that prepares the data for analysis in the residual generator.

The executive 615 passes the data on for preprocessing and tagging in a preprocessing subsystem 620. The preprocessing may include, for example, intensity and geometry correction. The tagging separates data into individual parts (i.e., of multiple parts being formed on a layer) and tags the data according to: part, scan strategy, e.g., bulk process (interior) or contour (edges); x-y position, i.e., where the laser is pointed; laser power; hatch spacing; direction of hatches, which may be unique to a specific machine.

With respect to the preprocessing corrections, there are several possible distortions embedded in the measured data relating to geometry and intensity. Due to physical distortions to the weld laser by the lens, the software driving the scan-head may pre-distort the cross-sectional pattern so that the lens rectifies the image. The AMM 605 may record the galvanometer drive signals which reflect that pre-distortion. Thus, images of the data created with those signals will be distorted and not accurate replications of the geometry of the part. Another optical-induced distortion is the non-flat photodiode response to the process across the build platform. This is caused by the mismatch between the design wavelength of the AMM 605 optics and the observation wavelength of the photodiodes. Creating a mechanism to account for this makes the photodiode response globally uniform while leaving unchanged the system's sensitivity to aberrant behaviors. The preprocessor 620 applies this correction to use the part tagging mask also generated by the AMM 605.

The tags applied to each point in the data stream of corrected sensor data, e.g., photodiode responses, may include corrected x and y positions in true spatial coordinates, a signal to indicate if the laser was on or off, the part number associated with the data point, the scan strategy, etc. The tags are used to isolate subsets of the data for residual generation, as discussed in further detail below.

The created arrays of data and tags will be passed to the residual generator 625 which selects a model to be evaluated from the model database, from a set of multiple models. The residual generator 625 computes differences between the output of the model, i.e., the predicted or expected value, with the measured sensor data streams. The computed residuals, with their respective tags, get passed to an MMHT subsystem 630 where there will be one or more MMHT algorithms (e.g., MMHT 1, MMHT 2, MMHT3). Each of the MMHT algorithms is configured to operate on a different subset of the sensor data, which is referred to as an averaging kernel.

For example, MMHT1 may have a set of models for evaluation over an averaging kernel which contains sensor data for laser on transients (LOTs), e.g., 100 samples from each time the laser turns on. For that 100 samples, the algorithm calculates one probability for each model of the set of models to produce probability density functions and output this information for further processing using, e.g., Bayes' rule. As a further example, the MMHT2 algorithm may be evaluating the same set of models but applying them to measured data samples falling within a specific region resulting from dividing the area of the build plate into a grid of subareas. As a further example, the MMHT3 algorithm may be applied to all samples from one particular part on the layer being analyzed. As a further example, an MMHT algorithm may be applied to samples from the entire layer. Other variations may include, e.g., applying a spatial grid to adjacent layers to create a 3D grid, thereby allowing analysis of multiple layers of a specific part.

One example of a kernel is defined by the first N samples in time at the start of a laser mark. Another example of a kernel is defined by all measurements with position (x,y) in a range of $\Delta x$ and $\Delta y$ from a point in space. It is also possible to define kernels based on other parameters such as a part number or a scan strategy identifier. The kernel is a key design parameter in the model-based monitoring algorithm because it determines resolution and sensitivity. Using different kernels, model-based analysis can be performed over different temporal and spatial scales. Classification results improve when evaluated over a larger sample of measurements, as correlations between measurements can be exploited and random variations are averaged out. However, spatial resolution is degraded when the classification is performed over a larger sample of measurements. One aspect of determining the measurement set is selecting which sensors to include in the analysis. Sensors that are collecting data simultaneously may offer orthogonal information, informative correlations, or redundant information that can be exploited to reduce noise.

The MMHT subsystem 630 may have a first stage which performs a normalization 632 of the received residuals, which is followed by the application of the averaging kernel 634 to create a dataset which is processed with, e.g., probability density functions and Bayes' rule 636 to produce an output for each algorithm of the MMHT subsystem 630. The normalization facilitates aggregation of residuals in arbitrarily defined kernels.

The outputs of the MMHT subsystem 630 are received by a fault indication/quality metrics subsystem 640 which, in disclosed embodiments, reports out the results of the MMHT algorithms. For example, if a model indicative of "normal conditions" has the highest probability in each of the MMHT algorithms, then a "normal" indicator may be output. In addition, the fault/quality subsystem 640 may trigger automated actions based on the output, such as, for example, stopping a build or flagging a part to skip downstream processing. This step, in the context of model-based monitoring, may involve applying criteria to decide what result to report. This may be a statistical test that guides the classification of likely process conditions, or an empirically-determined threshold that distinguishes normal from faulty conditions. In disclosed embodiments, individual fault classifications are tied to actionable information for the operator. The output may be on the order of a "stoplight" with well-defined triggers. For example, a part may have a smoke occlusion on one layer resulting in a "yellow" signal. This may be followed by specific actions, e.g., stopping the build or sending the part for extra inspection.

The system 600 provides a model creation subsystem 645, which includes a model builder 650 and a database 655 which stores example data sets. The created models are output to a model database 660 for use in the residual generator 625, as described above. The database 655 may be populated by performing standard builds with known parts. This generates example data sets which can be used to build models for different scan strategies, scan directions, position on build plate, etc., to help build the model database 660. In some cases, data sets may be generated during builds in which there is an attempt to create specific faults or the same behavior that would result from the specific fault. For example, the cause leading to a bigger melt pool than desired may not be known, but the same effect can be accomplished by increasing laser power, so that is done and a model is created under these conditions.

In addition to capturing the dynamic melt pool response, the process models can be improved by factoring in local effects of geometry, scan direction, and scan history. Local geometry describes the heterogeneous composition of loose power and fused material in the vicinity of the melt pool. This local geometry affects heat conduction away from the melt pool, which in turn affects the melt pool shape and temperature. Scan history also affects heat transfer from the melt pool, since recently scanned areas will have a higher local temperature if the melt pool returns to that area before cooling has completed. By capturing these spatially-dependent features, the predicted thermal response of the melt pool can be refined and the variation in the predicted response reduced.

In addition to affecting the actual thermal behavior of the melt pool, spatially dependent features of the geometry and scan path may also impact the perceived sensor response. For example, it has been observed in multiple sensing modalities that the detected intensity of parallel scans is slightly different depending on which direction the scanner is moving. The melt pool has a three-dimensional asymmetrical shape that can affect the aspect of the melt pool as viewed from a diagnostic sensor. Furthermore, local topology from previously-fused material adjacent to the melt pool may also affect how the melt pool is viewed by the sensor. Thus, by capturing spatially-depended features such as scan direction of previously-fused locations, the predicted sensor response can be refined and variation in the predicted response reduced.

In disclosed embodiments, features of geometry and scan path, as described above, can be pre-computed based on the associated computer-aided design and manufacturing files and represent model inputs. These features may also be computed from position and time measurements.

As discussed above, a static model can be used for the mean laser-on transient signature for normal conditions, i.e., a model that does not update with new measurement or input values. In such a case, a measured laser-on transient signature is analyzed using hypothesis testing to decide whether normal process conditions caused the observed response. If not, an anomaly can be reported or some other defined action can be taken. As explained above, this approach can be extended to test multiple models representing distinct process conditions such that specific faults can be distinguished. This is referred to as multiple model hypothesis testing (MMHT).

In disclosed embodiments, MMHT algorithms can be used to test for different faults, as described above, but using a dynamic model that predicts a response taking measured or known values as inputs, such as, for example: previous sensor measurements, laser power settings, geometric factors based on scan paths, location of the build plate, and other diagnostic measurements. Using dynamic models has the advantage of capturing more possible responses (i.e., evaluating more possible types of sensor data streams) with fewer parameters. Such a dynamic model could be used with the process parameters of interest captured in the model (i.e. as states). Instead of a statistical test to evaluate a finite number of hypothesized process conditions, a continuous-valued estimate of the process parameters could be obtained based on the observed dynamic input-response behavior.

In alternative embodiments, rather than inputting a set of the residuals computed by the residual generator 625 (i.e., one for each model) into each algorithm in the MMHT subsystem 630, a probability density function may be applied to the residual for each model first to determine a likelihood for each model. The likelihoods are input into each MMHT algorithm, where a kernel is applied, followed by application of Bayes' rule. Thus, in such a case, the PDF is applied before a subset of the data is determined by a kernel of an MMHT algorithm. This means that the PDF is performed on every data point, point-by-point. Such an approach is advantageous computationally but is a bit more restrictive, in that it requires assumptions about the probabilistic behavior of the models, i.e., it must be assumed they are not correlated in time.

Figure 7:
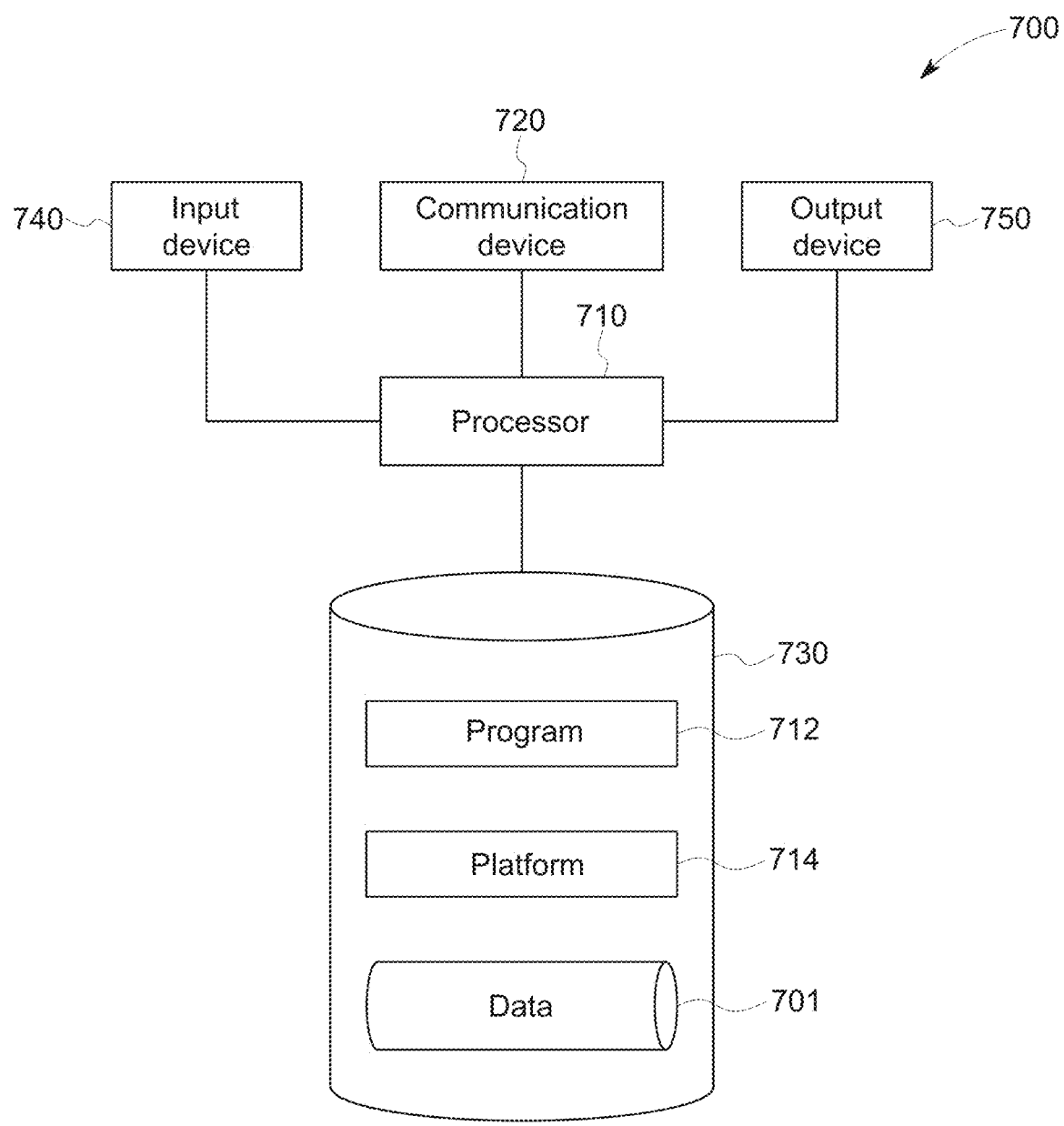
FIG. 7 is a block diagram of a system according to some embodiments.

FIG. 7 is a block diagram of apparatus 700 according to some embodiments. Apparatus 700 may comprise a general-purpose or special-purpose computing apparatus and may execute program code to perform any of the functions described herein. Apparatus 700 may comprise an implementation of one or more elements of the systems described above. Apparatus 700 may include additional elements which are not shown, according to some embodiments.

Apparatus 700 includes processor 710 operatively coupled to communication device 720, data storage device/memory 730, one or more input devices (not shown), and one or more output devices 730. The network interface 720 may facilitate communication with external devices, such as an application server. Input device(s) may be implemented in the apparatus 700 or in a client device connected via the network interface 720. The input device(s) may comprise, for example, a keyboard, a keypad, a mouse or other pointing device, a microphone, knob or a switch, an infrared (IR) port, a docking station, and/or a touch screen. Input device(s) may be used, for example, to manipulate graphical user interfaces and to input information into apparatus 700. Output device(s) 730 may comprise, for example, a display (e.g., a display screen) a speaker, and/or a printer.

Data storage device/memory 740 may comprise any device, including combinations of magnetic storage devices (e.g., magnetic tape, hard disk drives and flash memory), optical storage devices, Read Only Memory (ROM) devices, Random Access Memory (RAM) etc.

The storage device 740 stores a program and/or platform logic for controlling the processor 710. The processor 710 performs instructions of the programs and thereby operates in accordance with any of the embodiments described herein, including but not limited to the processes.

The programs may be stored in a compressed, uncompiled and/or encrypted format. The programs may furthermore include other program elements, such as an operating system, a database management system, and/or device drivers used by the processor 710 to interface with peripheral devices.

The foregoing diagrams represent logical architectures for describing processes according to some embodiments, and actual implementations may include more or different components arranged in other manners. Other topologies may be used in conjunction with other embodiments. Moreover, each system described herein may be implemented by any number of computing devices in communication with one another via any number of other public and/or private networks. Two or more of such computing devices of may be located remote from one another and may communicate with one another via any known manner of network(s) and/or a dedicated connection. Each computing device may comprise any number of hardware and/or software elements suitable to provide the functions described herein as well as any other functions. For example, any computing device used in an implementation of system 100 may include a processor to execute program code such that the computing device operates as described herein.

All systems and processes discussed herein may be embodied in program code stored on one or more computer-readable non-transitory media. Such media non-transitory media may include, for example, a fixed disk, a floppy disk, a CD-ROM, a DVD-ROM, a Flash drive, magnetic tape, and solid-state RAM or ROM storage units. Embodiments are therefore not limited to any specific combination of hardware and software.

Embodiments described herein are solely for the purpose of illustration. Those in the art will recognize other embodiments may be practiced with modifications and alterations to that described above.

What is claimed is:

1. A method for generating fault indications for an additive manufacturing machine based on a comparison of the outputs of multiple process models to measured sensor data, the method comprising:
   receiving, via a communication interface, sensor data from a plurality of sensors from the additive manufacturing machine during manufacture of at least one part;
   applying one or more preprocessing corrections to sensor data from at least one of the plurality of sensors, the preprocessing corrections accounts for at least one of geometric distortions or intensity distortions embedded in the sensor data;
   selecting a plurality of models from a model database, each model generating expected sensor values for a defined condition;
   computing difference values between a selected set of the sensor data and an output of each of the plurality of models;
   computing a probability density function defining, for each of the models, a likelihood that a given difference value corresponds to each respective model;
   applying a probabilistic rule to determine, for each of the models, a probability that the corresponding model output matches the received sensor data; and
   outputting an indicator of a defined condition corresponding to a model having the highest match probability.

2. The method of claim 1, further comprising tagging the received sensor data with an identifier of the at least one part.

3. The method of claim 1, further comprising tagging the received sensor data to indicate whether the laser was on or off when the sensor data was produced.

4. The method of claim 1, wherein the defined condition is one of (i) a fault condition or (ii) a quality metric.

5. The method of claim 1, further comprising receiving, via the communication interface, information identifying a selected set of sensors.

6. The method of claim 1, further comprising defining a kernel specifying a subset of the received sensor data which is used in computing the probability density function.

7. The method of claim 6, wherein the kernel contains received sensor data including at least one of (i) a set of laser on transients (LOTs), (ii) a set of samples in time at the start of a laser mark, (iii) a set of samples defined by all measurements with position (x, y) in a range of $\Delta x$ and $\Delta y$ from a point in space, (iv) a set of samples based on a part number, or (v) a set of samples based on a scan strategy identifier.

8. The method of claim 1, wherein the sensor data is received from an on-axis sensor and an off-axis sensor.

9. A system for generating fault indications for an additive manufacturing machine based on a comparison of the outputs of multiple process models to measured sensor data, the system comprising:
   a device comprising a communication interface configured to receive sensor data from the additive manufacturing machine during manufacture of at least one part, the device further comprising a processor configured to perform:

receiving, via a communication interface, sensor data from the additive manufacturing machine during manufacture of at least one component part;

applying one or more preprocessing corrections to sensor data from at least one of the plurality of sensors, the preprocessing corrections accounts for at least one of geometric distortions or intensity distortions embedded in the sensor data;

selecting a plurality of models from a model database, each model generating expected sensor values for a defined condition;

computing difference values between the received sensor data and an output of each of the plurality of models;

computing a probability density function defining, for each of the models, a likelihood that a given difference value corresponds to each respective model;

applying a probabilistic rule to determine, for each of the models, a probability that the corresponding model output matches the received sensor data; and outputting an indicator of a defined condition corresponding to a model having the highest match probability.

10. The system of claim 9, wherein the processor is further configured to perform tagging the received sensor data with an identifier of a part of the one or more parts.

11. The system of claim 9, wherein the processor is further configured to perform tagging the received sensor data to indicate whether the laser was on or off when the sensor data was produced.

12. The system of claim 9, wherein the defined condition is one of (i) a fault condition or (ii) a quality condition.

13. The system of claim 9, wherein the processor is further configured to perform defining a kernel specifying a subset of the received sensor data which is used in computing the probability density function.

14. The system of claim 13, wherein the kernel contains received sensor data including at least one of (i) a set of laser on transients (LOTs), (ii) a set of samples in time at the start of a laser mark, (iii) a set of samples defined by all measurements with position (x, y) in a range of $\Delta x$ and $\Delta y$ from a point in space, (iv) a set of samples based on a part number, or (v) a set of samples based on a scan strategy identifier.

15. A non-transitory computer-readable storage medium storing program instructions that when executed cause a processor to perform a method for generating fault indications for an additive manufacturing machine based on a comparison of the outputs of multiple process models to measured sensor data, the method comprising:

receiving, via a communication interface, sensor data from the additive manufacturing machine during manufacture of at least one part;

applying one or more preprocessing corrections to sensor data from at least one of the plurality of sensors, the preprocessing corrections accounts for at least one of geometric distortions or intensity distortions embedded in the sensor data;

selecting a plurality of models from a model database, each model generating expected sensor values for a defined condition;

computing difference values between the received sensor data and an output of each of the plurality of models;

computing a probability density function defining, for each of the models, a likelihood that a given difference value corresponds to each respective model;

applying a probabilistic rule to determine, for each of the models, a probability that the corresponding model output matches the received sensor data; and outputting an indicator of a defined condition corresponding to a model having the highest match probability.

16. The computer-readable storage medium of claim 15, the method further comprises tagging the received sensor data with an identifier of a first part of the one or more parts.

17. The computer-readable storage medium of claim 15, the method further comprises tagging the received sensor data to indicate whether the laser was on or off when the sensor data was produced.

18. The computer-readable storage medium of claim 15, wherein the defined condition is one of (i) a fault condition or (ii) a quality condition.

19. The computer-readable storage medium of claim 15, where at least one of the plurality of models is a model trained using an induced occurrence of one or more defined conditions.

20. The computer-readable storage medium of claim 15, wherein the one or more defined conditions includes at least one of a fault condition or a quality condition.

* * * * *